United States Patent
Palara

[11] Patent Number: 5,818,120
[45] Date of Patent: Oct. 6, 1998

[54] CIRCUIT FOR LIMITING AN OVERVOLTAGE ON A CONTROL SWITCH CONNECTED IN SERIES WITH AN INDUCTIVE LOAD

[75] Inventor: Sergio Palara, Acitrezza, Italy

[73] Assignee: SGS-Thomson Microelectronis, S.r.l., Agrate Brianza, Italy

[21] Appl. No.: 644,519

[22] Filed: May 10, 1996

[30] Foreign Application Priority Data

Jul. 31, 1995 [EP] European Pat. Off. .............. 95830345

[51] Int. Cl.$^6$ ....................................................... F02P 1/08
[52] U.S. Cl. ........................ 307/10.6; 327/584; 327/583; 307/10.1; 123/637
[58] Field of Search .................... 361/18, 88, 91, 361/124, 115, 106, 103, 247, 249, 253, 54, 56; 123/601, 603, 605, 609, 611, 623, 630, 650, 651, 652, 655, 656; 364/424.03; 307/9.1, 10.1, 10.6; 324/378, 380, 381; 340/622; 323/369, 907, 367; 327/583, 584, 378

[56] References Cited

U.S. PATENT DOCUMENTS

| 3,780,322 | 12/1973 | Walters ..................................... 327/584 |
| 4,090,488 | 5/1978 | Ohki ......................................... 123/651 |
| 4,233,951 | 11/1980 | Take ......................................... 123/625 |
| 4,291,319 | 9/1981 | Carinalli ................................... 357/13 |
| 4,359,652 | 11/1982 | Jarrett ....................................... 361/91 |
| 5,044,349 | 9/1991 | Benedikt .................................. 123/655 |
| 5,045,964 | 9/1991 | Bennett ..................................... 361/103 |
| 5,056,481 | 10/1991 | Podrapsky .............................. 123/651 |
| 5,111,798 | 5/1992 | Notaras ................................... 123/655 |
| 5,164,615 | 11/1992 | Walters ................................... 327/583 |
| 5,299,543 | 4/1994 | Taruya .................................... 123/630 |
| 5,581,131 | 12/1996 | Urushiwara ........................... 307/10.6 |

FOREIGN PATENT DOCUMENTS

| 0040260 | 11/1981 | European Pat. Off. . |
| 0382906 | 8/1990 | European Pat. Off. . |
| 2186739 | 1/1974 | France . |
| 2399148 | 7/1978 | France . |
| 2123635 | 2/1984 | United Kingdom . |

*Primary Examiner*—William M. Shoop, Jr.
*Assistant Examiner*—Peter Ganjian
*Attorney, Agent, or Firm*—David V. Carlson; Robert E. Mates

[57] ABSTRACT

An overvoltage limiting circuit having first and second terminals to produce a temperature-stable voltage proportional to an overvoltage condition. The overvoltage limiting circuit includes a first transistor having a first terminal connected to the first terminal of the circuit, a second terminal kept at a reference voltage relative to the second terminal of the circuit, and a control terminal coupled with the second terminal of the circuit through equivalent resistor means whose value depends on the value of the temperature-stable voltage so that the first transistor has a temperature-stable breakdown voltage.

21 Claims, 4 Drawing Sheets

CIRCUIT FOR LIMITING AN OVERVOLTAGE ON A CONTROL SWITCH CONNECTED IN SERIES WITH AN INDUCTIVE LOAD

BACKGROUND OF THE INVENTION

1. Field of the Invention

The present invention relates to overvoltage limiting circuits and in particular to a circuit for limiting an overvoltage on a control switch connected in series with an inductive load.

2. Description of the Related Art

The invention has application in automotive electronic ignition systems. In particular for ease understanding the description which follows is made with reference to a circuit for limiting an overvoltage on a control switch connected in series with an inductive load.

Conventional electronic ignition systems used with internal combustion engine include a control switch connected in series with an ignition coil. In many cases the control switch is provided by a bipolar transistor. Opening the control switch, the sudden change from a conduction state to an interdiction state of the transistor causes a transient overvoltage condition at its ends. This overvoltage condition can even be several times greater than the supply voltage of the electronic ignition system and can reach values and durations such as to exceed the safety limits set by the structural characteristics of the transistor and even destroy it.

With reference to FIG. 1, a first known technical solution to obviate this shortcoming calls for the use of an overvoltage limiting circuit designated by the reference number 1 having first and second terminals between which is applied an overvoltage condition Vs to be limited. Circuit 1 includes a NPN-type Darlington couple (T1,T2) provided by a transistor T1 connected between the first and the second terminals of the circuit 1 and a transistor T2 connected between the first terminal of the circuit 1 and a base terminal of the transistor T1, the transistor T2 being the driving transistor of the Darlington couple.

Circuit 1 also includes a Zener diode Z1 having an anode terminal connected to a base terminal of the transistor T2 and a cathode terminal connected to an intermediate node A included in a resistive divider (R1,R2). The resistive divider (R1,R2) is connected between the first and the second terminals of the circuit 1 and also includes first R1 and second R2 resistors connected in series together.

The overvoltage condition Vs is limited to a maximum value equal to:

$$Vs=[V(Z1)+Vbe_{T2}+Vbe_{T1}]*(R1+R2)/R2$$

where V(Z1) is the breakdown voltage of the Zener diode Z1 and $Vbe_{T1}$ and $Vbe_{T2}$ are thershold voltages of the transistors T1 and T2.

As shown in FIG. 2, in a second known technical solution the circuit 1 includes an NPN-type bipolar transistor T3 having a base terminal which is open. The transistor T3 is connected between the first terminal of the circuit 1 and the base terminal of the transistor T1.

In this case, the overvoltage condition Vs is limited to a maximum value equal to:

$$Vs=Vceo_{T3}+Vbe_{T1}$$

where $Vceo_{T3}$ is the collector-emitter junction breakdown voltage of the transistor T3 and $Vbe_{T1}$ is the threshold voltage of the transistor T1.

With reference to FIG. 3, a last known technical solution is described in European Patent Application no. 93830108.1 of the same applicant. It disclose that in substitution of the transistor T3 the circuit 1 includes a Zener diode chain.

Although advantageous from various viewpoints the above mentioned overvoltage limiting circuits have low precision because their breakdown voltage varies severely with temperature.

SUMMARY OF THE INVENTION

A principal object of the present invention is the provision of a circuit for limiting an overvoltage on a control switch connected in series with an inductive load having a temperature-stable breakdown voltage.

The preferred embodiment of the invention is implemented in an overvoltage limiting circuit for use in an electronic ignition system. The electronic ignition system includes an inductive load having a primary winding connected in series to a control switch on which is present an overvoltage condition. The overvoltage limiting circuit has first and second terminals to produce a temperature-stable voltage proportional to the overvoltage condition. The first terminal of the circuit is connected to the primary winding of the inductive load and the second terminal of the circuit is connected to a control terminal of the switch. The overvoltage limiting circuit includes a first transistor having a first terminal connected to the first terminal of the circuit, a second terminal kept at a reference voltage relative to the second terminal of the circuit, and a control terminal coupled with the second terminal of the circuit through equivalent resistor means whose value depends on the value of the temperature-stable voltage so that the first transistor has a temperature-stable breakdown voltage.

The features and advantages of the circuit according to the present invention will become apparent from the following description of an embodiment thereof, given by way of example and not limitation, with reference to the accompanying drawings.

DETAILED DESCRIPTION OF THE PREFERRED EMBODIMENT

The figures of the accompanying drawings generally and schematically illustrate a circuit for limiting an overvoltage on a control switch connected in series with an inductive load.

Figure 1:
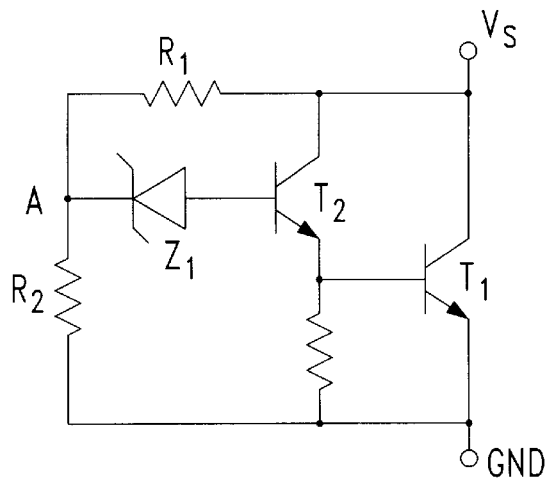
FIG. 1 is a circuit diagram of an overvoltage limiting circuit constructed according to the prior art.
Figure 2:
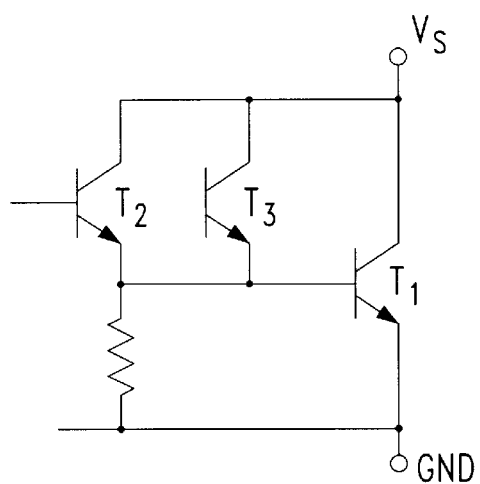
FIG. 2 is an embodiment of the circuit diagram illustrated in FIG. 1.
Figure 3:
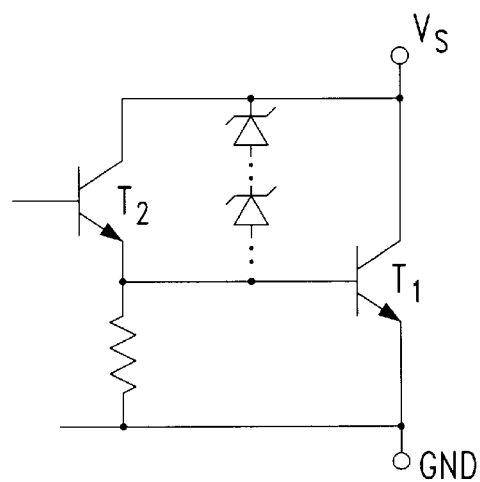
FIG. 3 is a further embodiment of the circuit diagram illustrated in FIG. 1.
Figure 4:
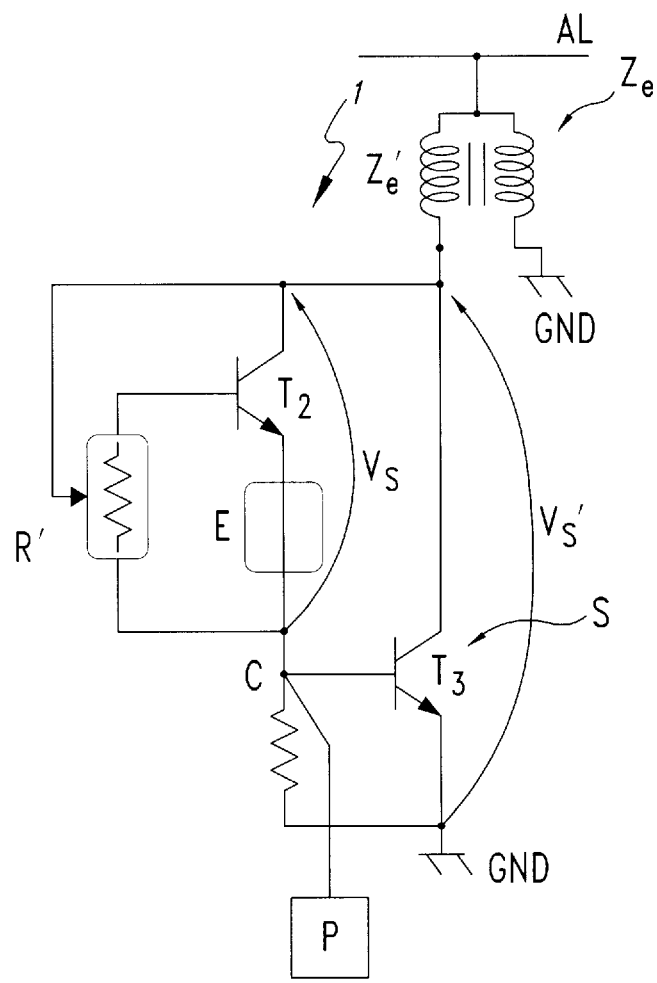
FIG. 4 is a simplified circuit diagram of a possible application of an overvoltage limiting circuit constructed according to the invention.

With particular reference to FIG. 4, a preferred embodiment of the inventive circuit is designated generally by reference number 1. Circuit 1 has first and second terminals to produce a temperature-stable voltage designated Vs proportional to an overvoltage condition Vs'. Specifically, the first terminal of the circuit 1 is connected to a primary winding Zl' of an inductive load Zl, said primary winding being also connected to a feed line AL. The second terminal of the circuit 1 is connected to a control terminal designated C of a switch S which also has a first terminal connected to the primary winding Zl' and a second terminal connected to a ground terminal GND. At the ends of the switch S is present the overvoltage condition Vs'. The switch S includes an NPN-type bipolar transistor T3 having a collector terminal corresponding to the first terminal of the switch S, an emitter terminal corresponding to the second terminal of the switch S and a base terminal corresponding to the control terminal C. The control terminal C is also connected to driving circuit means P not shown in FIG. 4 because conventional.

Circuit 1 also includes an NPN-type bipolar transistor T2 having a collector terminal connected to the first terminal of the circuit 1, an emitter terminal kept at a reference voltage E relative to the second terminal of the circuit, and a base terminal coupled with the second terminal of the circuit 1 through equivalent resistor means R'.

Figure 5:
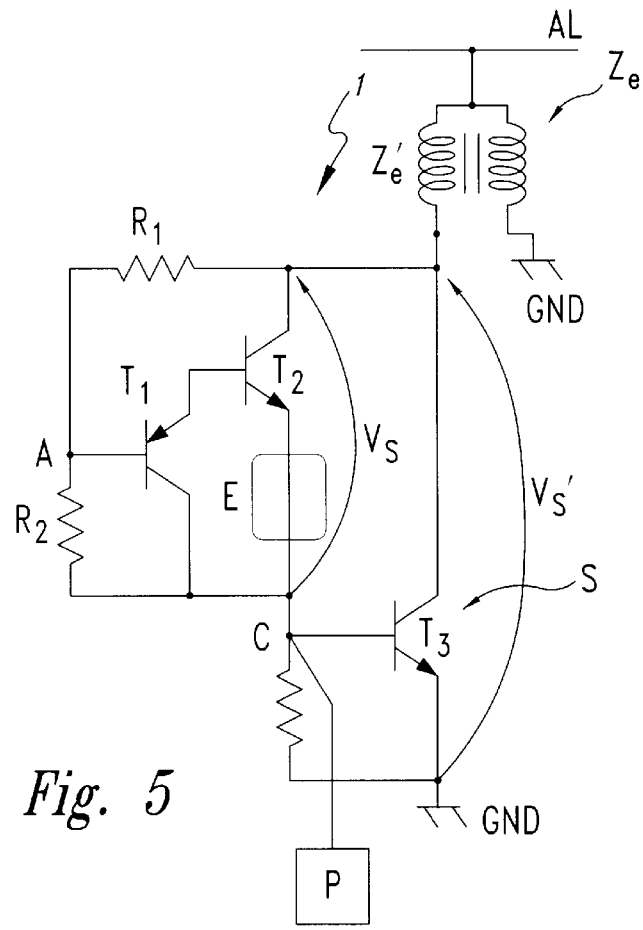
FIG. 5 is an embodiment of the circuit diagram illustrated in FIG. 4.

As shown in FIG. 5 the equivalent resistor means R' include a PNP-type bipolar transistor T1 having an emitter terminal connected to the base terminal of the transistor T2, a collector terminal connected to the second terminal of the circuit 1 and a base terminal connected to an intermediate node A included in a resistive divider (R1,R2). The resistive divider (R1,R2) is connected between the first and the second terminals of the circuit 1 and also includes first R1 and second R2 resistors connected in series together.

Figure 6:
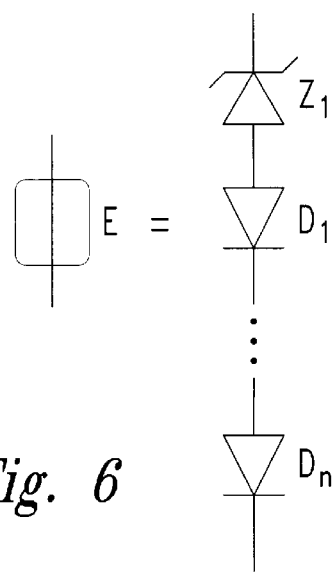
FIG. 6 is an embodiment of a detail of the circuit diagram illustrated in FIG. 4.

With reference to FIG. 6, the reference voltage E is generated by a plurality of one-way current flow circuit elements (Z1,D1, . . . Dn) connected together in series. The circuit elements (Z1,D1, . . . Dn) include a Zener diode Z1 with positive temperature coefficient and a plurality of conventional diodes (D1, . . . Dn) with negative temperature coefficient so as to make the reference voltage E temperature constant.

There is now described operation of the overvoltage limiting circuit 1 in accordance with the present invention. It is noted that on the basis of the collector-emitter breakdown characteristic of an NPN-type bipolar transistor having a resistor connected between base and emitter terminals, the transistor T2 has a collector-emitter junction breakdown voltage $Vcer_{T2}$ greater than the collector-emitter junction breakdown voltage $Vceo_{T2}$ present on the transistor T2 when the base terminal is open. The breakdown voltage $Vcer_{T2}$ is also smaller than the collector-emitter junction breakdown voltage $Vces_{T2}$ present on the transistor T2 when the base terminal is short circuited. In addition, the breakdown voltage $Vcer_{T2}$ depends on the value of the equivalent resistor means R'.

With reference to FIG. 5, the reference voltage E is equal to:

$$E = V_{R2} - Vbe_{T1} - Vbe_{T2}$$

where $V_{R2}$ is the voltage on the resistor R2 and $Vbe_{T1}$ and $Vbe_{T2}$ are threshold voltages of the transistors T1 and T2. In addition, when the transistor T2 is in conduction state the voltage Vs is equal to:

$$Vs = C_{R2} * (R1+R2)/R2 \qquad (1).$$

If, in a first approximation, it is assumed that:

$$E = V_{R2} \qquad (2)$$

being the reference voltage E and the resistive divider (R1,R2) temperature independent, from the formula (1) the voltage Vs will also be temperature-stable.

In this application it is assumed that the transistor T2 has a breakdown voltage $Vceo_{T2}$=350V and a breakdown voltage $Vces_{T2}$=800V. It is also assumed that E=20V, R1=95 kΩ and R2=5 kΩ.

Now referring to FIGS. 4 and 5 it is seen that the equivalent resistor means R' are equal to:

$$R' = E*R1*R2/\{hfe_{T1}*(R1+R2)*[E - Vs*R2/(R1+R2)]\} \qquad (3)$$

where $hfe_{T1}$ is the current gain of the transistor T1. From the formula (3) it is inferred that for low values of the voltage Vs the equivalent resistor means R' have a very low value as shown in the graph illustrated in FIG. 7. In this case the transistor T2 is in a condition near breakdown voltage $Vces_{T2}$.

Figure 7:
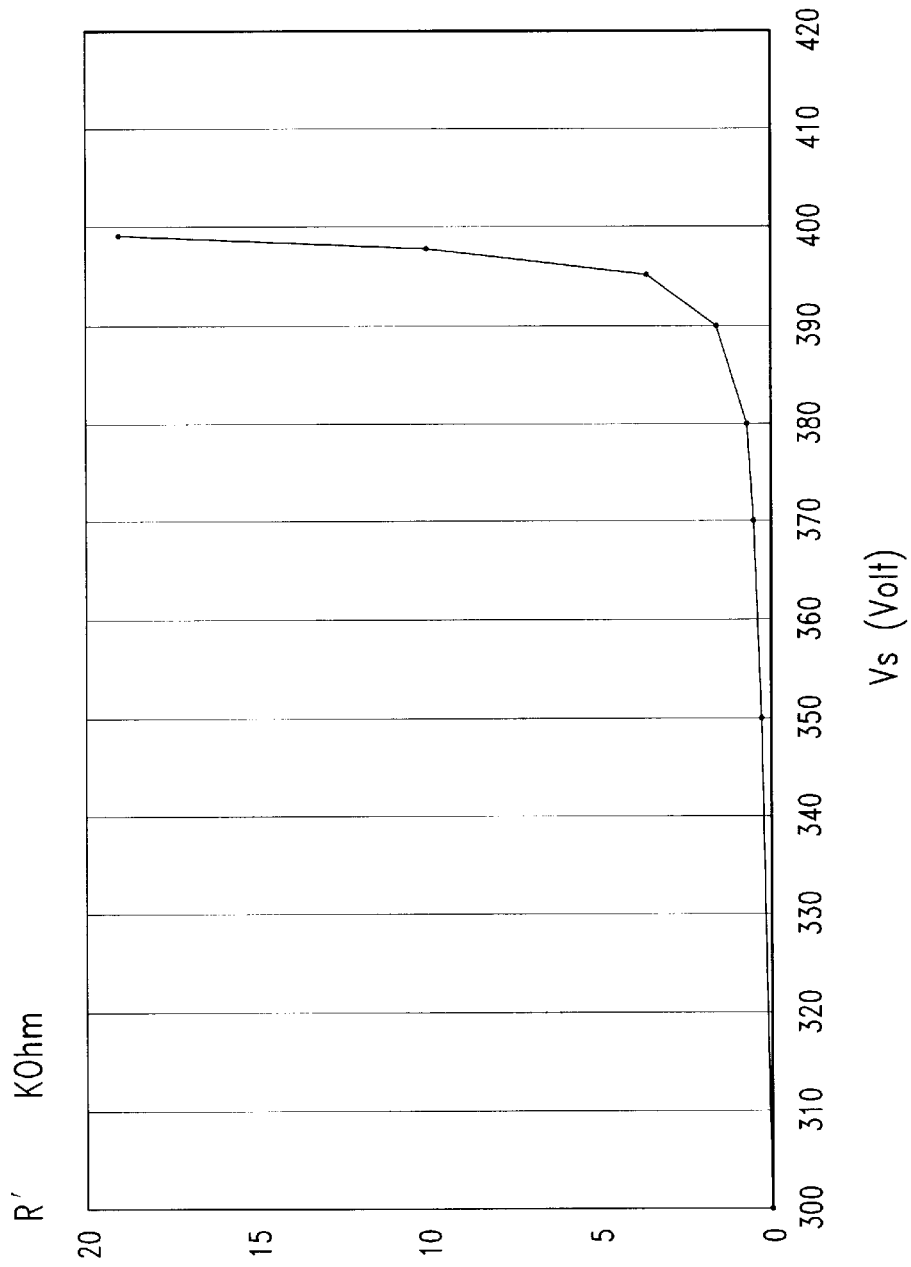
FIG. 7 shows the relationship between two variables present in the circuit diagram illustrated in FIG. 4.

When approaching the condition in which:

$$VR2 = Vs*R2/(R1+R2) = E \qquad (4),$$

by substituting this value in the formula (3) it is found that the value of the equivalent resistor means R' tends to infinite. In this case the transistor T2 is in a condition near the breakdown voltage $Vceo_{T2}$. With reference to FIG. 7, it is noted that in this condition the voltage Vs is greater than the breakdown voltage $Vceo_{T2}$, which is assumed equal to 350V, so that the transistor T2 tends to go into breakdown, reducing the voltage at its ends and hence reducing the overvoltage condition Vs'. Again with reference to FIG. 7, it is also seen that when the voltage Vs decreases, the value of the equivalent resistor means R' decreases and the breakdown voltage of the transistor T2 assumes a value equal to $Vcer_{T2} > Vceo_{T2}$. Consequently, the voltage Vs modulates the value of the equivalent resistor means R' in accordance with the formula (3) keeping the transistor T2 in breakdown at a voltage value which is taken from the formula (4) and is equal to:

$$Vcer_{T2} = E*(R1+R2)/R2$$

As may be seen, this breakdown voltage is temperature-stable as the reference voltage E and the resistors R1 and R2 are temperature-stable.

In conclusion the circuit in accordance with the present invention has a breakdown voltage which is temperature-stable. This breakdown voltage has also a predetermined value between the values of the voltages $Vceo_{T2}$ and $Vces_{T2}$.

What is claimed is:

1. An overvoltage limiting circuit having first and second terminals to produce a temperature-stable voltage representative of an overvoltage condition, the overvoltage limiting circuit comprising:

a first transistor having a first terminal connected to the first terminal of the overvoltage limiting circuit, a second terminal kept at a temperature-stable reference voltage relative to the second terminal of the overvoltage limiting circuit, and a control terminal coupled to the second terminal of the overvoltage limiting circuit through an equivalent resistor whose resistance value depends on the temperature-stable reference voltage so that said first transistor has a temperature-stable breakdown voltage.

2. The overvoltage limiting circuit of claim 1 wherein the equivalent resistor comprises a second transistor having a first terminal connected to the control terminal of the first transistor, a second terminal connected to the second terminal of the overvoltage limiting circuit and a control terminal driven by a resistive divider.

3. The overvoltage limiting circuit of claim 2 wherein the resistive divider is connected between the first and second terminals of the overvoltage limiting circuit and includes first and second resistors connected in series together.

4. The overvoltage limiting circuit of claim 1 wherein the temperature-stable reference voltage is generated by a plurality of one-way current flow circuit elements connected in series together.

5. The overvoltage limiting circuit of claim 4 wherein the plurality of one-way current flow circuit elements include at least one Zener diode with a positive temperature coefficient and a plurality of conventional diodes with negative temperature coefficients so that the temperature-stable reference voltage is stable with respect to changes in temperature.

6. The overvoltage limiting circuit of claim 1 wherein the first transistor is an NPN-type bipolar transistor.

7. The overvoltage limiting circuit of claim 2 wherein the second transistor is a PNP-type bipolar transistor.

8. An overvoltage limiting circuit for use in an electronic ignition system, the overvoltage limiting circuit having first and second terminals to produce a temperature-stable voltage proportional to an overvoltage condition present in the electronic ignition system, the overvoltage limiting circuit comprising:

a first transistor having a first terminal connected to the first terminal of the overvoltage limiting circuit, a second terminal kept at a temperature-stable reference voltage relative to the second terminal of the overvoltage limiting circuit, and a control terminal coupled to the second terminal of the overvoltage limiting circuit through an equivalent resistor whose resistance value depends on the temperature-stable reference voltage so that said first transistor has a temperature-stable breakdown voltage.

9. The overvoltage limiting circuit of claim 8 wherein the equivalent resistor comprises a second transistor having a first terminal connected to the control terminal of the first transistor, a second terminal connected to the second terminal of the overvoltage limiting circuit and a control terminal driven by a resistive divider.

10. The overvoltage limiting circuit of claim 9 wherein the resistive divider is connected between the first and second terminals of the overvoltage limiting circuit and includes first and second resistors connected in series together.

11. The overvoltage limiting circuit of claim 8 wherein the temperature-stable reference voltage is generated by a plurality of one-way current flow circuit elements connected in series together.

12. The overvoltage limiting circuit of claim 11 wherein the plurality of one-way current flow circuit elements include at least one Zener diode with a positive temperature coefficient and a plurality of conventional diodes with negative temperature coefficients so that the temperature-stable reference voltage is stable with respect to changes in temperature.

13. The overvoltage limiting circuit of claim 8 wherein the first transistor is an NPN-type bipolar transistor.

14. The overvoltage limiting circuit of claim 9 wherein the second transistor is a PNP-type bipolar transistor.

15. An overvoltage limiting circuit for use in an electronic ignition system including an inductive load having a primary winding connected in series with a control switch on which is present an overvoltage condition, the overvoltage limiting circuit comprising:

first and second terminals to produce a temperature-stable voltage proportional to the overvoltage condition, the first terminal of the overvoltage limiting circuit being connected to the primary winding of the inductive load and the second terminal of the overvoltage limiting circuit being connected to a control terminal of the control switch;

a first transistor having a first terminal connected to the first terminal of the overvoltage limiting circuit, a second terminal kept at a temperature-stable reference voltage relative to the second terminal of the overvoltage limiting circuit, and a control terminal coupled to the second terminal of the overvoltage limiting circuit through an equivalent resistor whose resistance value depends on the temperature-stable reference voltage so that said first transistor has a temperature-stable breakdown voltage.

16. The overvoltage limiting circuit of claim 15 wherein the equivalent resistor comprises a second transistor having a first terminal connected to the control terminal of the first transistor, a second terminal connected to the second terminal of the overvoltage limiting circuit and a control terminal connected to an intermediate node included in a resistive divider.

17. The overvoltage limiting circuit of claim 16 wherein the resistive divider is connected between the first and second terminals of the overvoltage limiting circuit and also includes first and second resistors connected in series together through the intermediate node.

18. The overvoltage limiting circuit of claim 15 wherein the temperature-stable reference voltage is generated by a plurality of one-way current flow circuit elements connected in series together.

19. The overvoltage limiting circuit of claim 18 wherein the one-way current flow circuit elements include at least one Zener diode with a positive temperature coefficient and a plurality of conventional diodes with negative temperature coefficients so that the temnerature-stable reference voltage is stable with respect to changes in temperature.

20. The overvoltage limiting circuit of claim 15 wherein the first transistor is an NPN-type bipolar transistor.

21. The overvoltage limiting circuit of claim 16 wherein the second transistor is a PNP-type bipolar transistor.

* * * * *